United States Patent
Kishinevsky et al.

(10) Patent No.: US 6,664,739 B1
(45) Date of Patent: Dec. 16, 2003

(54) ENHANCED ELECTRON EMISSIVE SURFACES FOR A THIN FILM DEPOSITION SYSTEM USING ION SOURCES

(75) Inventors: Michael Kishinevsky, Manalapay, NJ (US); Andrew Shablin, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 14 days.

(21) Appl. No.: 10/030,169
(22) PCT Filed: Aug. 1, 2000
(86) PCT No.: PCT/US00/20907
§ 371 (c)(1),
(2), (4) Date: Jun. 21, 2002
(87) PCT Pub. No.: WO01/09918
PCT Pub. Date: Feb. 8, 2001

Related U.S. Application Data

(60) Provisional application No. 60/146,738, filed on Aug. 2, 1999.

(51) Int. Cl.$^7$ ................................. H05H 1/02
(52) U.S. Cl. ........................ 315/111.41; 315/111.91; 313/361.1; 313/362.1
(58) Field of Search .................. 315/111.41, 111.91; 313/361.1, 362.1

(56) References Cited

U.S. PATENT DOCUMENTS 5,763,989 A * 6/1998 Kaufman ............... 313/361.1

\* cited by examiner

*Primary Examiner*—David Vu
(74) *Attorney, Agent, or Firm*—Benjamin Hudson, Jr.

(57) ABSTRACT

The invention pertains to the use of enhanced electron emitting surfaces to increase the supply of electrons in a thin film deposition system including the ion source in order to enhance the deposition rates of thin film materials. The use of enhanced electron emitting surfaces reduces the erosion of component parts in the ion source while increasing the rate and quality of the film deposited on the substrate. Allowing for ion source operation at lower gas pressure also increases the range of cold-cathode applications and improving operation at all pressures. The cathode section of the ion source is comprised of a reactive material that upon reaction with a reactive gas forms an insulating thin film on the cathode surface that provides an addition source of electrons for the ion beam source. Also, electron emitters located outside of the ion beam source have cathode sections that comprise enhanced electron emitting surfaces to provide electron flow to the ion beam.

12 Claims, 5 Drawing Sheets

ENHANCED ELECTRON EMISSIVE SURFACES FOR A THIN FILM DEPOSITION SYSTEM USING ION SOURCES

RELATED APPLICATIONS

This application is a 371 of PCT/US00/20907 which claims the benefit of the commonly assigned provision application Ser. No. 60/146,738 filed Aug. 2, 1999 the contents of which are incorporated herein by reference.

BACKGROUND OF THE INVENTION

1. Field of the Invention

Generally, the invention pertains to the field of vacuum thin film position using ion sources. Specifically, the invention focuses upon enhancing the supply of electrons in various regions of the deposition system including the ion source in order to enhance the deposition of thin films onto substrates and expand the range of thin film deposition apparatus, methods, and applications.

2. Brief Description of the Prior Art

The existing literature, such as "Handbook of Ion sources" edited by Bernard Wolf (CRC Press, 1995), hereby incorporated by reference, teaches that most types of ion sources as well as application apparatus require a source of electrons. In applications of all types of ion sources where the substrate or other surfaces being exposed to ion beam are insulating, the need exists to neutralize the electrical charge induced by the ion beam and this typically is done using an electron source since electrons have negative charge. In addition, those skilled in the field of ion sources know that electron supply plays a fundamental role in the ion source operation. In plasma-type ion sources, the electrons produce ions by ionizing the working gas. The electrons also conduct current such that power can be continuously coupled to the plasma. Therefore, it may be desirable to have electron emitters within the ion source to provide an enhanced continuous supply of electrons.

A significant problem with the use of cold cathode ion sources is that the secondary emission processes that generate electrons in these systems are not very efficient necessitating the use of a high discharge voltage to sustain stable operation. The use of high discharge voltage, however, may lead to defects in the films deposited on the substrate because high discharge voltages may generate fast particles that may subsequently collide with the surface of the substrate.

A significant problem with the use of hot filament thermionic electron emitters is that the operational lifetime of the emitters is very limited, often less than 100 hours. This is especially true when reactive gases, such as oxygen, are present in the ion source. Similarly, a problem with dispenser type thermionic emitters is that the operating life of these units is also limited, and compatibility with reactive gases remains a problem even though such emitters operate at lower temperature and produce higher current as compared to thermionic electron emitters. Similarly, hollow cathode electron emitters have a lifetime of only about 1000 hours as disclosed by U.S. Pat. Nos. 3,156,090; 3,913,320; 3,952,228; 3,956,666; and 3,969,646, each hereby incorporated by reference.

Another problem with existing sputtering techniques is the erosion of the component parts of the ion source due to incidental sputtering of material from the surface of such component parts. This incidental sputtering reduces the operating life of such component parts and also increases the costs of maintenance and of operating the ion source.

Still another problem associated with incidental sputtering of material from surfaces of component parts is that the material sputtered from these surfaces may be deposited onto the substrate surface contaminating the material deposited on the substrate or it may create flaws in the materials deposited on the substrate surface.

The present invention discloses a system that addresses each of the above-mentioned problems associated with the existing methods and apparatus used for deposition of films onto the surfaces of substrates. The invention while alleviating the above-mentioned problems does not reduce the existing range of ion source applications. On the contrary, it expands the cold-cathode ion source application range by allowing for source operation at lower gas pressure and improving operation at all pressures. Surprisingly, this invention makes use of a phenomenon known as "target poisoning" which prior to the instant invention has been considered a serious problem in the processing of substrates using cold cathode magnetron sputtering. Target poisoning occurs when sputtering metal or semiconductor material from a magnetron target in the presence of a reactive gas, such as oxygen. Under these conditions, the target surface tends to develop and sustain a thin ceramic-like insulating layer of oxide that in most cases is the same material that is being deposited on the substrate. This "target poisoning" results in a lower removal rate of metal from the target and a correspondingly lower deposition rate on the substrate because the ceramic-like insulator is much harder to sputter than the bulk target material. As such the prior art, teaches that the deposition of such ceramic-like insulator should be avoided in magnetron systems by the use of sputtering methods having high removal rates of material from the target surface thereby insuring that oxide will not accumulate. One example of such a method is taught by M. Alex, C. Van Nutt and S. Gupta in ADC-Reactive Sputtering of $Al_2O_3$" attached hereto and hereby incorporated by reference. Efforts to eliminate "target poisoning" acted to teach away from the direction the instant invention takes in that by focusing on methods to eliminate poisoned surfaces from magnetron sputtering processes it diverted attention away from the beneficial uses of "poisoned materials".

SUMMARY OF THE INVENTION

The present invention includes a variety of aspects that relate to the process of film deposition onto substrate material using ion sources. The invention addresses the efficiency, the throughput of the deposition process, the range of ion source operating parameters, and the quality of thin film deposition onto substrates.

Accordingly, a significant object of the invention is to produce a stable and consistent supply of electrons over a wide range of discharge parameters. Attaining this goal can be difficult because, as mentioned above, the secondary electron emissions produced by the cold-cathode processing can be low. This invention focuses on increasing the electron emissive properties of various surfaces within and outside of the ion source thereby providing an enhanced supply of electrons.

Another object of the invention is to increase the output of the ion beam of ion sources that do not utilize hot cathodes. When the output of the ion beam is increased, the deposition rate onto the substrate is increased. This increased rate is particularly desirable for the commercial processing of substrates where increased throughput translates into lower cost of production. Increasing the output of the ion beam, however, requires an additional supply of electrons to intensify the discharge inside the ion source and to negate the additional charges generated. The instant invention increases the supply of electrons that in turn allows the use of increased ion beam output.

Still another object of the invention is to reduce the erosion of the ion beam apparatus elements. The erosion of these apparatus elements not only shortens the operating life of the element itself but may also be deposited as a contaminate on the substrates which are being processed. This invention reduces the sputtering of materials from the apparatus elements helping to alleviate both of these problems.

Yet another broad goal of the invention is to provide surfaces with enhanced electron emissive properties for industrial applications that are inexpensive with respect to the initial investment for the enhanced electron emitting surfaces and also inexpensive with respect to maintenance of such surfaces.

Naturally further objects of the invention are disclosed throughout other areas of the specification.

DETAILED DESCRIPTION OF THE PREFERRED EMBODIMENTS

The present invention includes a variety of aspects that may be combined in different ways. Each of these aspects is discussed separately below.

As discussed earlier, target poisoning significantly reduces the amount of material that can be sputtered from the target material. This may become a benefit for the ion source parts because sputtering of the ion source material is undesirable as discussed previously. "Poisoned" surfaces also have enhanced electron emission properties that are very stable and consistent over wide range of discharge parameters. In film deposition methods, using cold cathode ion beam sources in which the supply of electrons can be deficient, such poisoned or coated surfaces can be beneficial when they are properly used within the deposition apparatus.

Figure 1:
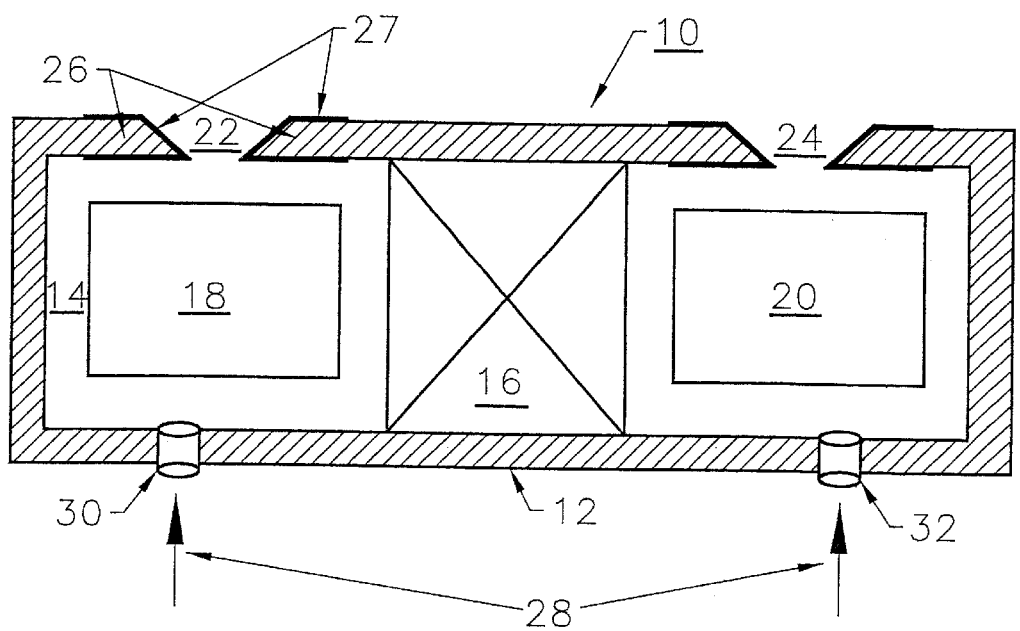
FIG. 1 is a sectional view that illustrates a particular embodiment of the invention wherein the cathodes of an ion source contain a material that may grow insulating films in the presence of a reactive gas.

In one embodiment of the invention shown by FIG. 1 there is illustrated a cross section of an ion source that incorporates the principles of this invention. An ion source 10 that is generally based on an anode layer design is generally comprised of a grounded steel housing 12 that includes a gas containment housing 14. The gas containment housing 14 contains a magnetic field generating means 16 that may be a permanent magnet or electromagnetic coil. A positively biased anode shown in cross section at 18 and 20 is spaced a short distance λ below openings or magnetic gaps 22 and 24. The surfaces such as 26 that form the magnetic gaps 22 and 24 in the housing 12 are the cathodes of the ion source 10. The openings or magnetic gaps 22 and 24 allow the ion beam generated to exit the ion source 10. To enhance the generation of electrons in the ion source the cathodes 26 may be comprised of a material such as aluminum, titanium, silicon or other material that in the presence of a reactive gas forms an insulating thin film. As an alternate, the cathodes may be formed by applying a coating 27 to the surfaces of the cathodes 26 with these materials. These cathodes represent the "poisoned surfaces" as described herein above. A reactive gas 28, such as oxygen, on the order of about five per cent to one hundred per cent where the application permits, is introduced into the manifold via the gas feeds 30 and 32. The reactive gas 28 on the cathodes 26 will cause these surfaces to produce an enhanced supply of electrons.

FIG. 1 is an example of an embodiment of the invention of an ion source with a cold cathode closed drift path. This type of ion source is similar to the type manufactured by Advanced Energy Industries, the assignee of the instant application, although the invention may be used with any similar ion source. With the modification to the cathode-surfaces 26 as described above, the minimum gas pressure required for operation of the cold cathode closed drift ion source was reduced down to about $1 \times 10^{-6}$ Torr. The capability of operating at this lower pressure expands the range of applications for cold-cathode ion sources. At higher pressures the ion beam current was significantly increased as compared to unmodified or uncoated cathodes under the same operating conditions.

Figure 2:
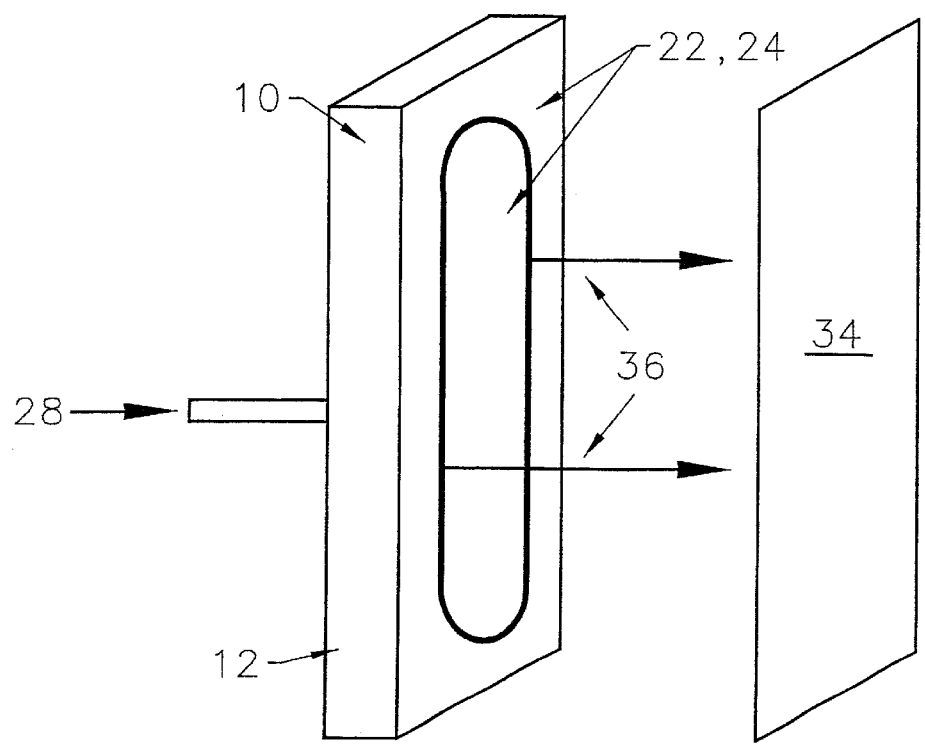
FIG. 2 is a perspective view of the embodiment of the invention shown in FIG. 1 in which an ion beam is applied to a substrate material.

Referring to FIG. 2 there is illustrated a perspective view of the ion source 10 that was shown in cross section in FIG. 1. As seen in this Figure the magnetic gaps 22 and 24 through which the ions are produced is in the form of a racetrack, or oval configuration. The ion source 10 is operated in a diffused beam mode and uses a working gas 28 of argon with about five per cent or more oxygen, although other reactive gases may be used as described herein above. A glass substrate 34 exposed to an ion beam 36 produced by an ion source 10 with an aluminum or aluminum coated cathodes 26 had a reduced amount of contamination material on the substrate, and the contamination material was transparent since the deposited aluminum was oxidized. Under the same conditions a similar glass substrate processed with traditional or uncoated cathodes was heavily contaminated with iron to the degree that it was not transparent. Similar reductions in contamination of the substrate combined with making the contamination less harmful (e.g. transparent) may be expected in other similar applications.

Figure 3:
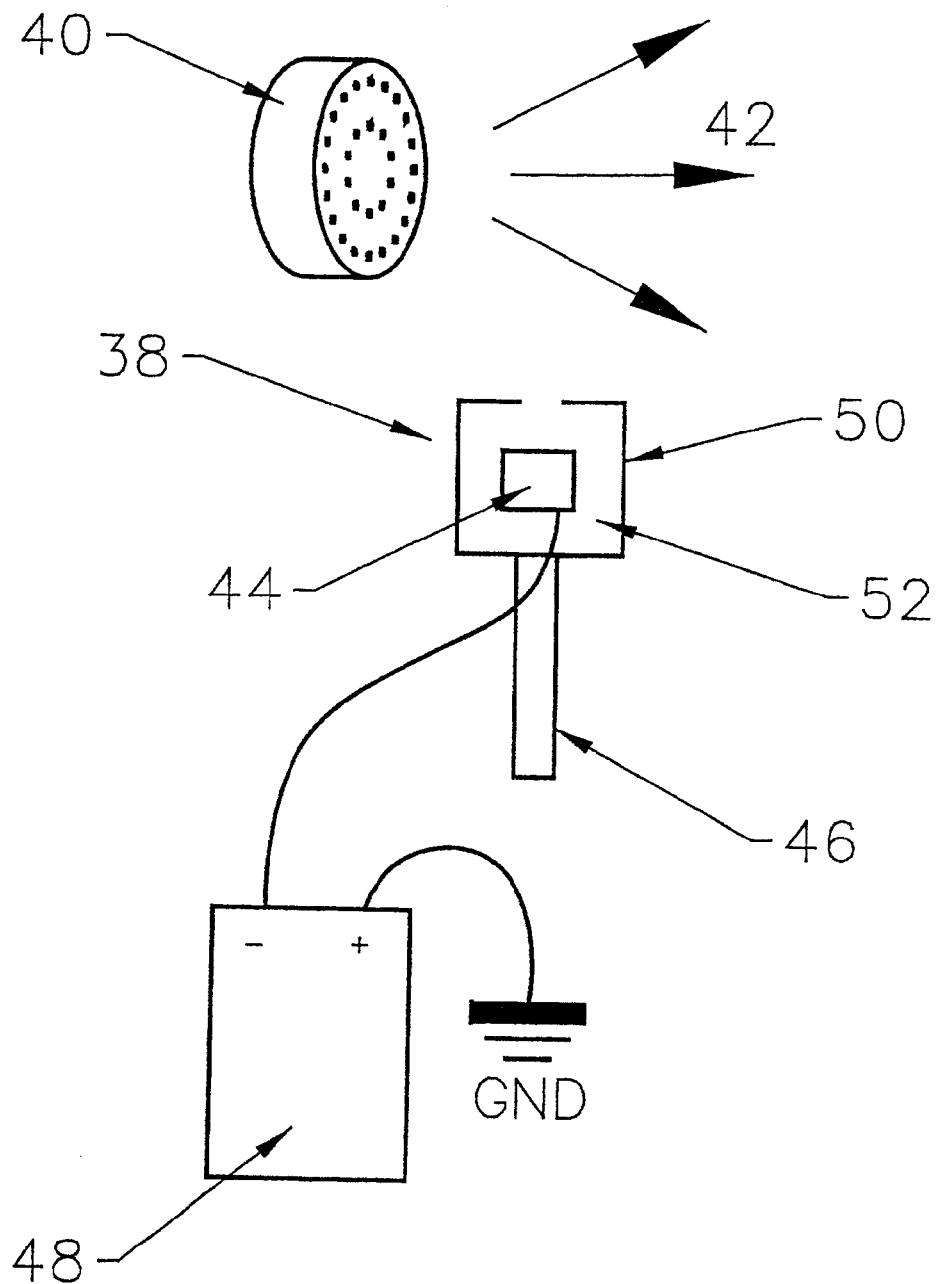
FIG. 3 illustrates an embodiment of the invention showing a magnetron-like device with a poisoned cathode used to neutralize charges in an ion beam and to supply electrons to enhance the source operation.
Figure 4:
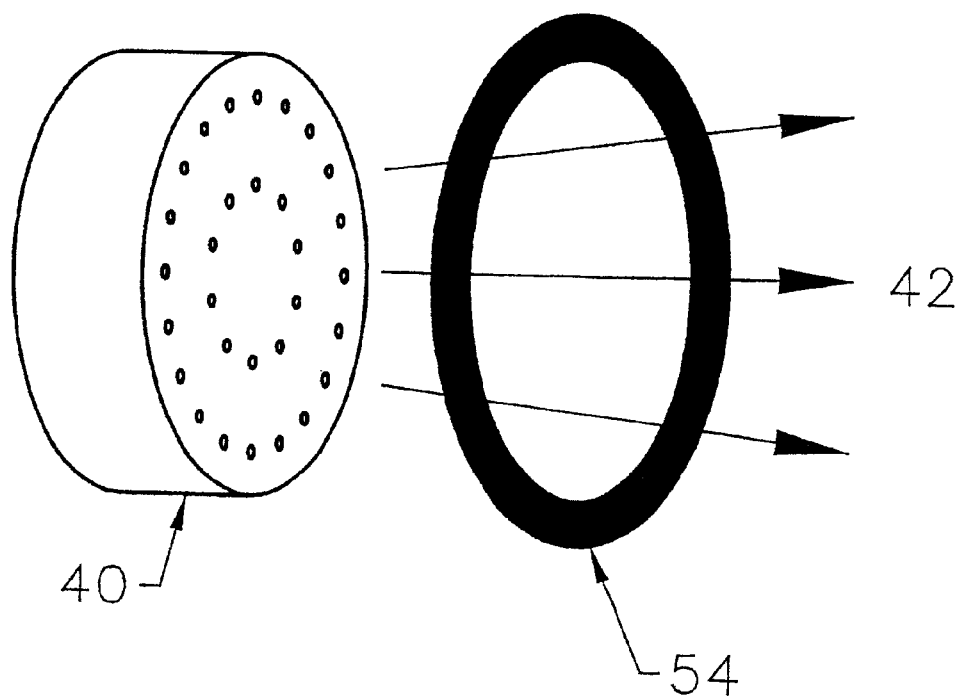
FIG. 4 illustrates an embodiment of the invention shown in FIG. 3 showing a magnetron-like device which has an annular shape surrounding the ion source.

In another embodiment of the invention, as shown in FIG. 3, the "poisoned" surfaces may be implemented as a little Penning cell or magnetron like electron emitter device 38 located outside of the ion source 40 in close proximity to the ion beam 42. The electron emitter device shown in FIG. 3 is in cross section, but such a device may also have an annular shape circumventing the ion source as shown by FIG. 4. In either case, the cathode 44 can be made out of aluminum or is aluminum coated and oxygen gas can be fed into the device via gas delivery device 46. The power supply 48 can be of DC, AC or pulsed DC type, depending on the arc suppression needs in the particular application. The positive terminal of the power supply is shown in FIG. 3 connected to a ground, but it can be also connected to any electrode of the ion source or additional electrodes in the apparatus, depending on the particular application needs. The Penning cell or magnetron-like device 38 may also have an optional gas containing case 50 around it to reduce gas flow into the system and also an optional discharge ignition electrode 52.

FIG. 4 illustrates a perspective view of the enhanced electron beam 54 generated by the annular shaped electron emitter 40 around the ion beam 42. In FIGS. 3 and 4 the ion source 40 may be multi-cell ion source similar to the type manufactured by Advanced Energy Industries, the assignee of the instant application, although other ion sources may be used.

Figure 5:
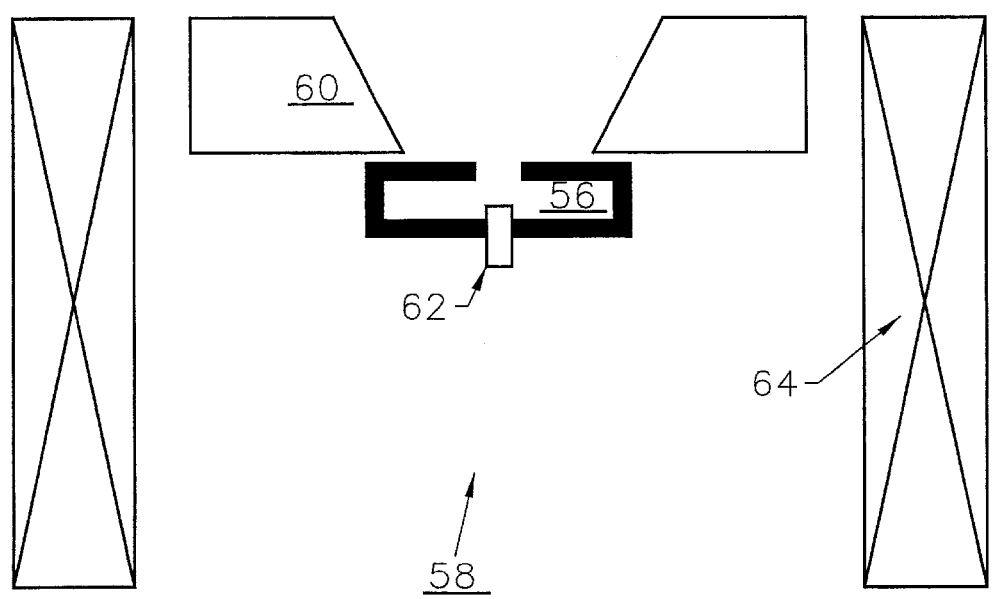
FIG. 5 illustrates an embodiment of the invention showing the electron emitting device with poisoned surfaces inside a Penning type ion source.

In yet another embodiment the magnetron-like electron emitter device 56 similar to that described in previous paragraph can be installed inside of the ion source 58, as shown in FIG. 5. Here the ion source is of the Penning type multi-channel source and the construction could be similar to one described by A. A. Bizioukov et. al. in "Multichannel source of synthesized ion-electron flow", Rev. Sci. Instrum, 67 (12), 1996, page 4117–4119, which is hereby incorporated by reference, but could take various other configurations as well. With regard to this embodiment, the anode 60 is conical and the separately powered magnetron-like electron emitter device 56 is mounted at the inner end of the anode. The device may also have an ignition electrode 62. This electron emitting device may use the same magnetic field as the ion source which is created using a solenoid or other magnetic field generating device 64.

This embodiment also uses a cathode that has a surface comprised of a material such as aluminum, titanium, silicon or other material that in the presence of a reactive gas forms an insulating thin film. Igniting the reactive gas with the cathode reactive materials generates an electron flow that combines with the ion beam. The "poisoning" of the cathode with the insulating thin film serves to provide an additional source of electrons for the ion beam.

As can be easily understood, the basic concepts of the present invention may be embodied in a variety of ways. It involves both techniques for creating and using enhanced electron emissive surfaces as well as components that are specifically configured for various sputtering applications. In this application, the techniques for creating and using enhanced electron emissive surfaces are disclosed as part of the results shown to be achieved by the various devices described and as steps which are inherent to utilization. They are simply the natural result of utilizing the devices as intended and described. In addition, while some devices are disclosed, it would be understood that these not only accomplish certain methods but also can be varied in a number of ways. Importantly, as to all of the foregoing, all of these facets should be understood to be encompassed by this disclosure.

Where the invention is described in device-oriented terminology, each element of the device implicitly performs a function. Apparatus claims may not only be included for the device described, but also method or process claims may be included to address the functions the invention and each element performs. Neither the description nor the terminology is intended to limit the scope of the claims.

It should be understood that a variety of changes may be made without departing from the essence of the invention. Such changes are also implicitly included in the description.

In addition, each of the various elements of the invention and claims may also be achieved in a variety of manners. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled. As but one example, it should be understood that all action might be expressed as a means for taking that action or as an element that causes that action. Similarly, each physical element disclosed should be understood to encompass a disclosure of the action that that physical element facilitates. Regarding this last aspect, the disclosure of an "electron emitter" should be understood to encompass disclosure of the act of "emitting electrons" whether explicitly discussed or not and, conversely, were there only disclosure of the act of "emitting electrons", such a disclosure should be understood to encompass disclosure of an "electron emitter". Such changes and alternative terms are to be understood to be explicitly included in the description.

Any references mentioned in this application for patent as well as all references listed in any information disclosure filed with the application are hereby incorporated by reference or should be considered as additional text or as an additional exhibit or attachment to this application; however, to the extent statements might be considered inconsistent with the patenting of this/these invention(s) such statements are expressly not to be considered as made by the applicant (s).

What we claim is:

1. An ion beam source, comprising:
   a metallic housing;
   a gas input into the housing for receiving a reactive gas;
   a magnetic field generating means for producing a magnetic field within the housing;
   at least one magnetic gap wherein the opposite sides of the magnetic gap define a cathode attached to the housing;
   at least one anode in the housing in proximity to the magnetic gap; and
   the cathode section of the housing comprising a reactive material wherein reaction of the reactive gas with the cathode reactive material surface forms an insulating thin film that enhances electron emission.

2. An ion beam source as recited in claim 1 wherein the cathode reactive material is from the group of materials such as aluminum, titanium, silicon, or materials that when reacting with reactive gases forms an insulating thin film.

3. An ion beam source as recited in claim 2 wherein the reactive gas is from the group of gases such as oxygen, fluorides, or other gases and gas mixtures that when reacting with the cathode reactive material surface forms an insulating thin film.

4. An ion beam source as recited in claim 1 wherein the parts of the cathode surfaces are coated with a reactive material wherein reaction of the reactive gas with the cathode reactive material surface forms an insulating thin film.

5. An ion beam source as recited in claim 4 wherein the cathode reactive material is from the group of materials such as aluminum, titanium, silicon, or materials that when reacting with reactive gases form an insulating thin film.

6. An ion beam source as recited in claim 5 wherein the reactive gas is from the group of gases such as oxygen, fluorides, or other gases and gas mixtures that when reacting with the cathode reactive material surface forms an insulating thin film.

7. An ion beam source in combination with an electron emitter, comprising:
- a source for generating an ion beam;
- an electron emitter in proximity to the ion beam generally comprising:
  - a magnetic field generating means for producing a magnetic field;
  - a cathode comprising a reactive material surface wherein reaction of the reactive gas with the cathode reactive material surface forms an insulating thin film that enhances electron emission; and
  - a power supply connected to the cathode section of the housing for generating an electron flow for interaction with the ion beam.

8. An ion beam source in combination with an electron emitter as recited in claim 7 wherein the cathode reactive material is from the group of materials such as aluminum, titanium, silicon, or materials that when reacting with reactive gases form a thin insulating film.

9. An ion beam source in combination with an electron emitter as recited in claim 8 wherein the reactive gas is from the group of gases such as oxygen, fluorides, or other gases and gas mixtures that when reacting with the cathode reactive material forms a thin insulating film.

10. An ion beam source in combination with an electron emitter as recited in claim 7 wherein the cathode section of the housing is coated with a reactive material wherein reaction of the reactive gas with the cathode reactive material forms an insulating thin film.

11. An ion beam source in combination with an electron emitter as recited in claim 10 wherein the cathode reactive material is from the group of materials such as aluminum, titanium, silicon, or materials that when reacting with reactive gases forms an insulating thin film.

12. An ion beam source in combination with an electron emitter as recited in claim 11 wherein the reactive gas is from the group of gases such as oxygen, fluorides, or other gases and gas mixtures that when reacting with the cathode reactive material forms an insulating thin film.

* * * * *